United States Patent [19]

Sakamoto et al.

[11] Patent Number: 4,999,762

[45] Date of Patent: Mar. 12, 1991

[54] HIGH VOLTAGE POWER SOURCE DEVICE

[75] Inventors: Kazuho Sakamoto, Soraku; Takashi Niwa, Nara; Haruo Suenaga, Soraku; Takahiro Matsumoto, Nara, all of Japan

[73] Assignee: Matsushita Electric Industrial Co., Ltd., Osaka, Japan

[21] Appl. No.: 500,254

[22] Filed: Mar. 27, 1990

[30] Foreign Application Priority Data

Mar. 27, 1989 [JP] Japan .................................. 1-75314

[51] Int. Cl.$^5$ .............................................. H02M 1/00
[52] U.S. Cl. .................................... 363/144; 361/397; 361/410
[58] Field of Search ................. 363/144, 147, 20, 21, 363/37, 131; 361/397, 410, 414

[56] References Cited

U.S. PATENT DOCUMENTS

| | | | |
|---|---|---|---|
| 4,737,903 | 4/1988 | Nishikawa et al. | 363/144 |
| 4,772,999 | 9/1988 | Fiorina et al. | 363/144 |
| 4,868,462 | 9/1989 | Chattin | 363/144 |

Primary Examiner—Peter S. Wong
Attorney, Agent, or Firm—Wenderoth, Lind & Ponack

[57] ABSTRACT

A high voltage power source device which comprises an electric power source; a low voltage circuit constituted by an inverter circuit including a semiconductor switching element and a capacitor for converting an electric power from the electric power source into a high frequency electric power; a magnetron; a high voltage transformer for converting the high frequency electric power into a high voltage and supplying the high voltage to the magnetron; and a printed circuit board having an electric wiring system formed thereon for connection with and support thereon of the inverter circuit and a high voltage circuit for the voltage boosted by the high voltage transformer. The printed circuit board has separate areas defined therein, and the low and high voltage circuits are formed respectively on the separate areas of the printed circuit board. The printed circuit board includes a patterned grounding conductor formed at the boundary between the separate areas and also has either a plurality of openings defined therein so as to extend completely through a thickness of the printed circuit in alignment with the patterned grounding conductor, or a plurality of generally elongated electroconductive pieces each having opposite ends connected with the patterned grounding conductor.

4 Claims, 4 Drawing Sheets

Fig. 4
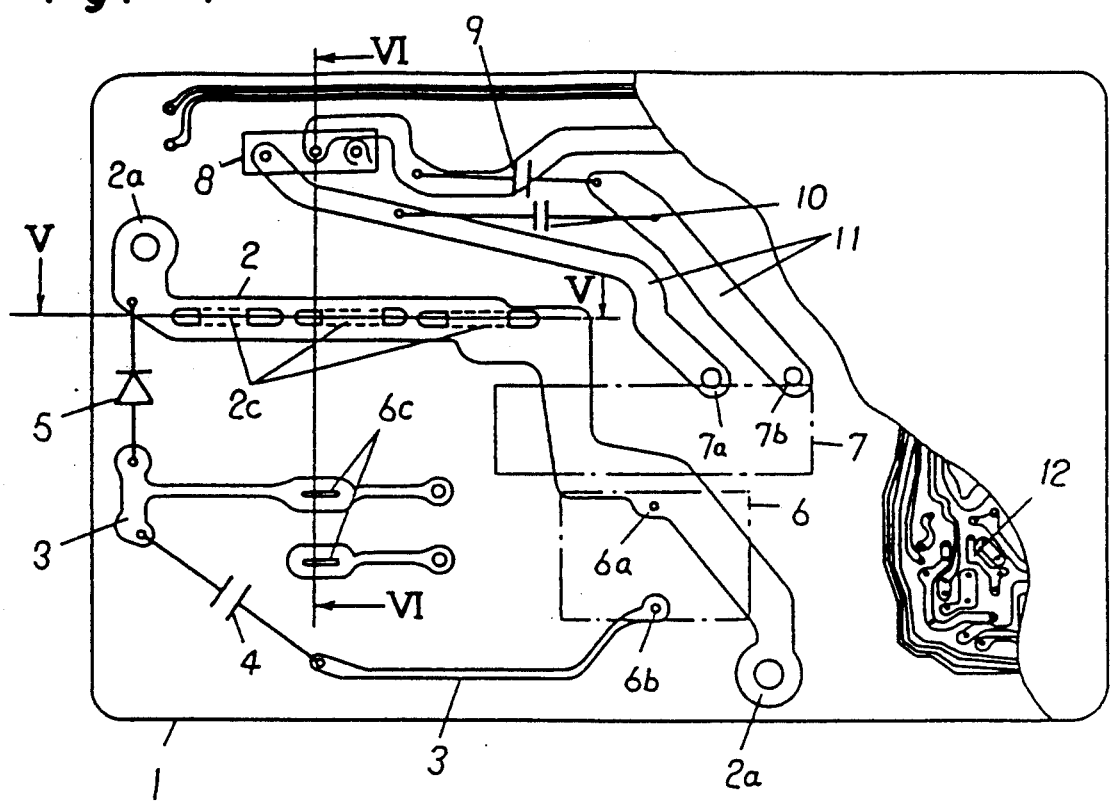
Fig. 5
Fig. 6
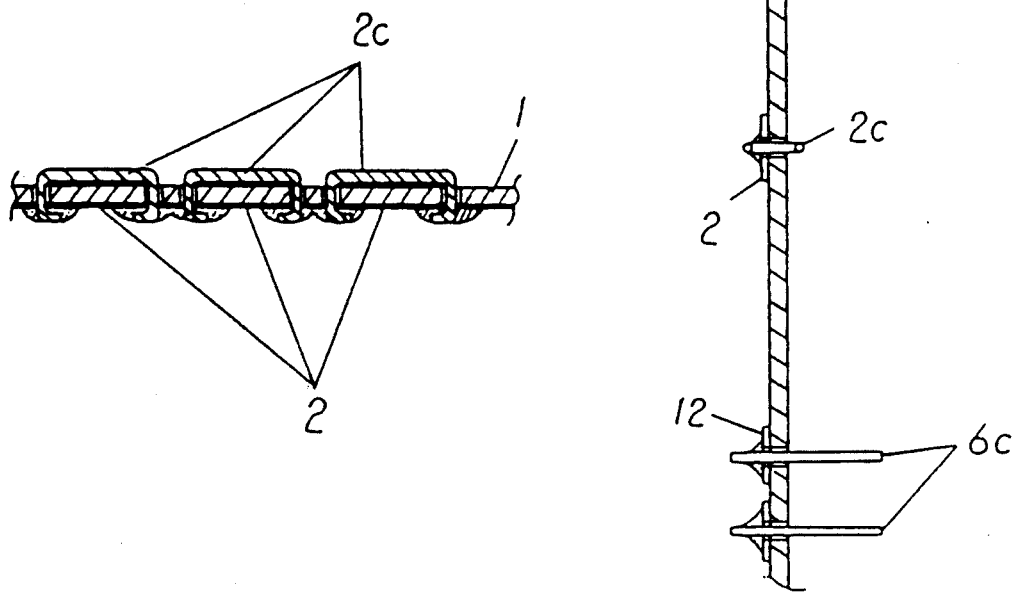

HIGH VOLTAGE POWER SOURCE DEVICE

BACKGROUND OF THE INVENTION

1. Field of the Invention

The present invention relates to an inverter circuit for use in, for example, an electronic oven comprising a semiconductor switching element for converting an electric power available from a commercial power outlet into a high frequency electric power, and a high voltage power source device for use in the electronic oven for boosting such high frequency electric power and for supplying it to a magnetron.

2. Description of the Prior Art

An electronic oven employing such a high voltage power source device as shown in FIG. 8 of the accompanying drawings is disclosed in, for example, the Japanese Laid-open Patent Publication No. 62-190692, published in 1987. The prior art high voltage power source device shown in FIG. 8 comprises a printed circuit board 1 having only one of the opposite surfaces formed with a patterned grounding conductor 2 to avoid any possible leakage of electric power between a high voltage circuit and a low voltage circuit. However, since the patterned grounding conductor 2 is formed only on one surface of the printed circuit board 1, the patterned grounding conductor 2 does not work on the leakage of electric power occurring on the opposite surface of the same printed circuit board 1. Also, since this electric power converting device is used in an electronic oven, and since the printed circuit board 1 may often been contaminated by vapor originating from food material being heated within the oven and/or moisture component and dust afloat in a kitchen, there is a relatively high possibility that the high voltage circuit and the low voltage circuit are electrically shortcircuitted through deposits of those contaminants.

As hereinabove discussed, even though the patterned grounding conductor 2 is formed on one surface of the printed circuit board 1, a deposit of contaminants such as, for example, water droplets and/or dust tends to constitute a cause for an unwanted leakage of electric power from the opposite surface to the surface of the printed circuit board 1 on which the grounding conductor 2 is formed and, therefore, the formation of the patterned grounding conductor 2 only on such surface of the printed circuit board 1 is ineffective to eliminate the occurrence of a leakage of electric power between the opposite surfaces of the printed circuit board 1.

SUMMARY OF THE INVENTION

The present invention has been devised with a view to substantially eliminating the above discussed problem and has for its essential object to eliminate any possible leakage of a high voltage in the high voltage circuit to the patterned grounding conductor through openings and/or slits in the event that contaminants such as, for example, water droplets and/or dust deposit on the surface of the printed circuit board opposite to the surface thereof where the patterned grounding conductor is formed.

It is another object of the present invention to eliminate the occurrence of any possible leakage while securing a high safety factor by allowing the voltage in the high voltage circuit to be connected with a metal wiring even though contaminants such as, for example, water droplets and/or dust deposit on the surface of the printed circuit board opposite to the surface thereof where the patterned grounding conductor is formed.

In order to accomplish the above described objects of the present invention, there is provided, in accordance with a preferred embodiment of the present invention, a high voltage power source device comprises a printed circuit board having first and second surfaces opposite to each other and also having high and low voltage circuits formed respectively on separate portions of the first surface of the printed circuit board. The high voltage power source device also comprises a patterned grounding conductor formed on the first surface of the printed circuit board and at the boundary between the separate portions of the surface thereof. The printed circuit board has a plurality of openings such as, for example, slits or apertures, defined in alignment with the patterned grounding conductor so as to extend completely through the thickness of the printed circuit board.

In the high voltage power source device according to the first preferred embodiment of the present invention, even when contaminants such as, for example, water droplets and/or dust deposit on the second surface of the printed circuit board which is opposite to the first surface thereof where the patterned grounding conductor is formed, a voltage in the high voltage circuit can be coupled with the patterned grounding conductor through the openings. Also, the presence of the openings in the printed circuit board in alignment with the patterned grounding conductor increases the leakage distance and, therefore, the voltage breakdown characteristic of the printed circuit board can advantageously be improved.

According to another preferred embodiment of the present invention, a high voltage power source device comprises a printed circuit board having first and second surfaces opposite to each other and also having high and low voltage circuits formed respectively on separate portions of the first surface of the printed circuit board. The high voltage power source device also comprises a patterned grounding conductor formed on the first surface of the printed circuit board and at the boundary between the separate portions of the surface thereof, and a plurality of generally elongated conductive pieces such as, for example, metal wires or metal foils, disposed on the second surface of the printed circuit board, each of said conductive pieces having its opposite ends connected with the patterned grounding conductor on the first surface of the printed circuit board.

In the high voltage power source device according to the second preferred embodiment of the present invention, even when contaminants such as, for example, water droplets and/or dust deposit on the second surface of the printed circuit board which is opposite to the first surface thereof where the patterned grounding conductor is formed, a voltage in the high voltage circuit can be grounded through the conductive pieces. Also, even when the patterned grounding conductor breaks as a result of cracking in the printed circuit board, the conductive pieces are effective to ensure a firm grounding of the voltage in the high voltage circuit therethrough.

BRIEF DESCRIPTION OF THE DRAWINGS

These and other objects and features of the present invention will become clear from the following description taken in conjunction with preferred embodiments thereof with reference to the accompanying drawings, in which:

FIG. 4 is a plan view, with a portion cut away, of the high voltage power circuit according to a second preferred embodiment of the present invention;

FIG. 5 is a cross-sectional view, on a somewhat enlarged scale, of the high voltage power source device taken along the line V—V in FIG. 4;

FIG. 6 is a cross-sectional view, on a somewhat enlarged scale, of the high voltage power source device taken along the line VI—VI in FIG. 4;

DETAILED DESCRIPTION OF THE EMBODIMENTS

Figure 1:
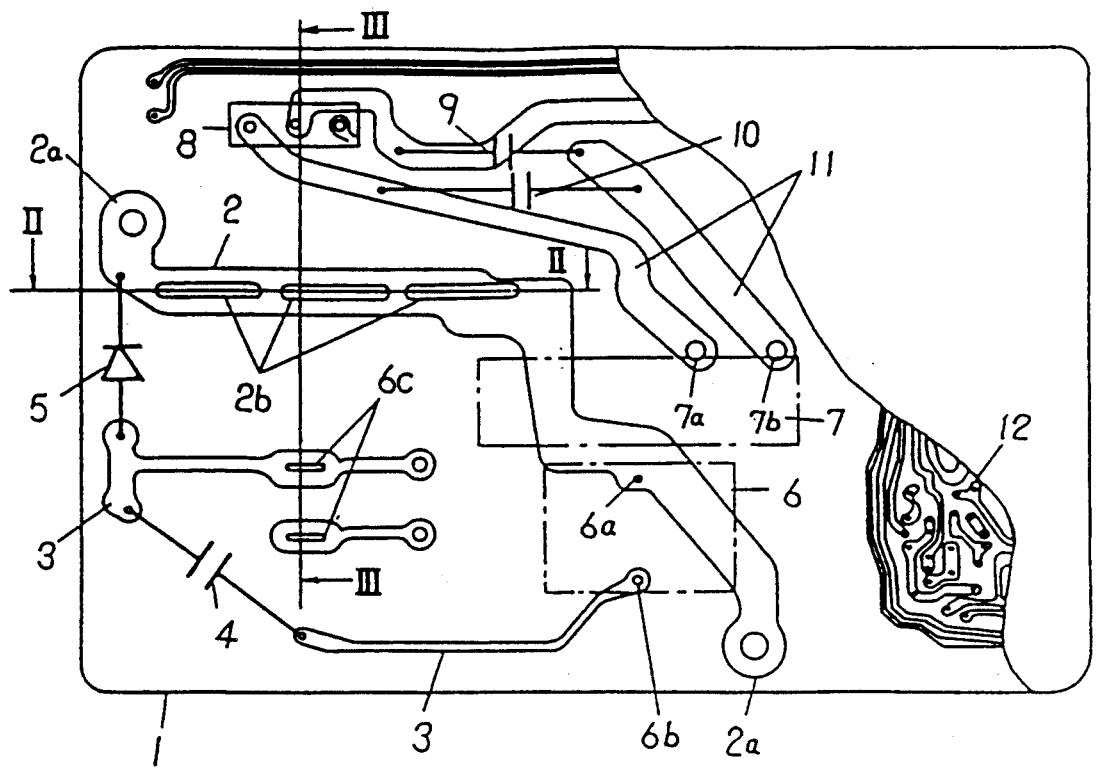
FIG. 1 is a plan view, with a portion cut away, of a high voltage power circuit according to a first preferred embodiment of the present invention.

Before the description of the preferred embodiments of the present invention proceeds, it is to be noted that like parts are designated by like reference numerals throughout the several views of the accompanying drawings.

Figure 2:
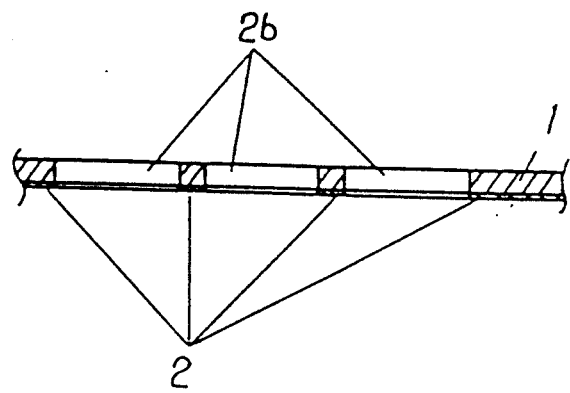
FIG. 2 is a cross-sectional view, on a somewhat enlarged scale, of the high voltage power source device taken along the line II—II in FIG. 1.
Figure 3:
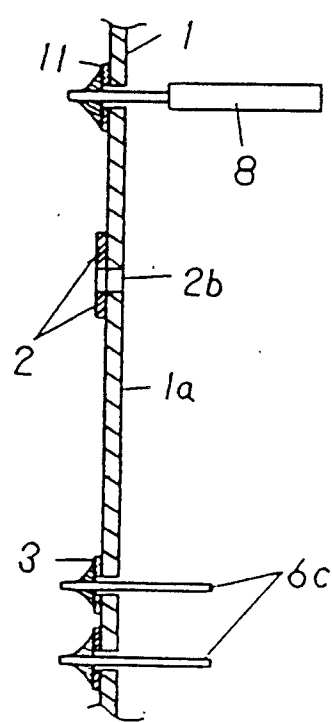
FIG. 3 is a cross-sectional view, on a somewhat enlarged scale, of the high voltage power source device taken along the line III—III in FIG. 1.

Referring first to FIGS. 1 to 3 showing a first preferred embodiment of the present invention, a high voltage power source device shown therein comprises a high voltage circuit including a high voltage capacitor connected with a high voltage terminal 6b of a secondary winding of a high voltage transformer through a patterned high voltage conductor 3, a high voltage diode 5 and high voltage heater terminals 6c, and a low voltage circuit including a semiconductor switching element 8 connected with terminals 7a and 7b of a primary winding of the high voltage transformer through patterned low voltage conductors 11, a smoothing capacitor 9, a resonating capacitor 10 and a control circuit 12. At the boundary between the high voltage circuit and the low voltage circuit, a patterned grounding conductor 2 is formed.

Figure 7:
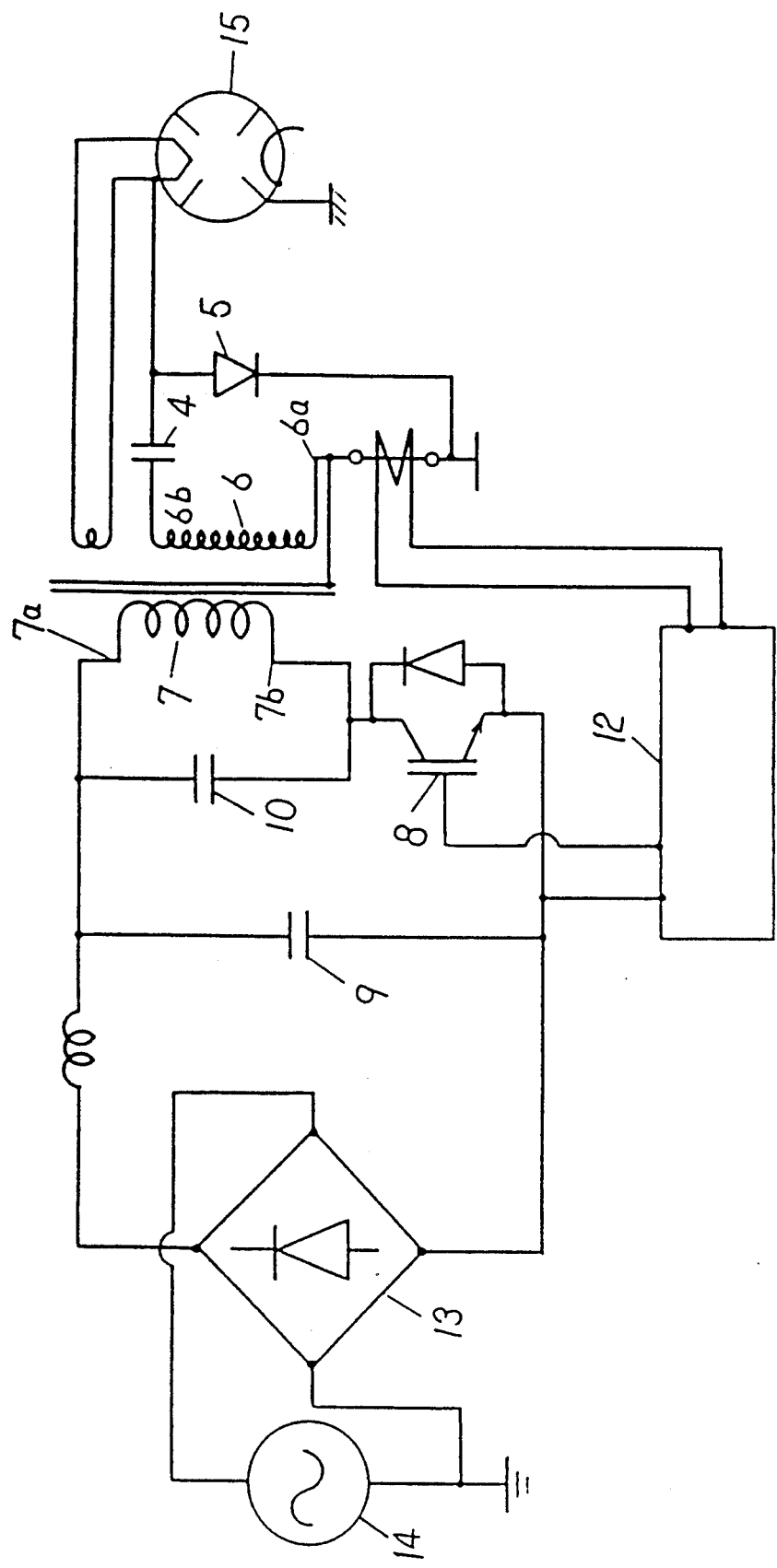
FIG. 7 is a circuit diagram showing the high voltage power source device.

With the use of the high voltage capacitor 4 and the high voltage diode 5, an output from the high voltage terminal 6b of the secondary winding of the high voltage transformer is provided in the form of a half-wave step-up voltage of about 4,000 volts which is in turn supplied to a magnetron 15 shown in FIG. 7. The magnetron 15 is grounded through a housing of an electronic oven, and the grounding conductor 2 is connected at a grounding terminal 2a with the housing of the electronic oven by means of a screw member or any other suitable fastening member and at the opposite end with the low voltage terminal 6a of the secondary winding of the high voltage transformer, thereby completing a closed loop on the side of the secondary winding of the transformer.

The low voltage circuit is operable to rectify an electric current available from a commercial power outlet to provide a high frequency current. Therefore, the electric potential relative to the earth is not so high since one of the paired commercial power lines is connected to the earth, and is, for example, within the range of about 100 to 200 volts and, therefore, no voltage breakdown will substantially occur.

If a printed circuit board 1 having first and second surfaces opposite to each other is contaminated with water droplets and/or dust depositing on the first surface thereof where the grounding conductor 2 is formed and/or is wetted, the breakdown voltage of each of the high voltage circuit and the low voltage circuit will be lowered. However, since the grounding conductor 2 is formed at the boundary between the high and low voltage circuits as hereinbefore described, a voltage flowing in the high voltage circuit can be grounded through the grounding conductor 2 and will not leak into the low voltage circuit and particularly into portions of the patterned low voltage conductors 11 adjacent the semiconductor switching element 8.

Figure 8:
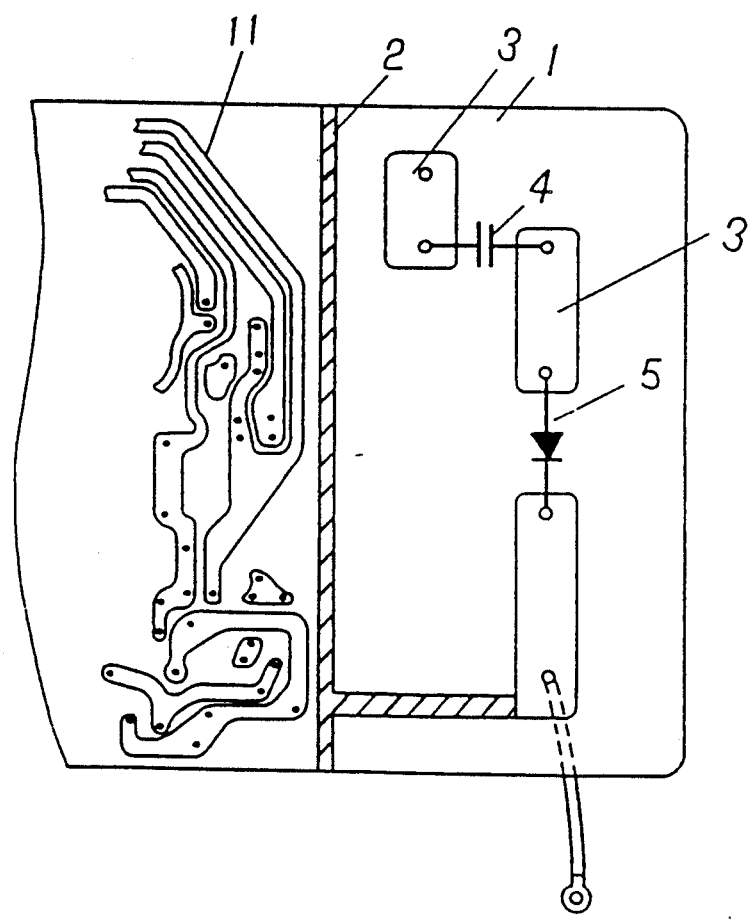
FIG. 8 is a fragmentary plan view of the prior art high voltage power source device.

Also, even when water droplets and/or dust deposit on the second surface 1a of the printed circuit board 1 which is opposite to the first surface where the grounding conductor 2 is formed and on which electronic component parts are mounted, the voltage flowing in the high voltage circuit can be grounded through the grounding conductor 2 by means of grounding slits 2b so defined in the printed circuit board 1 as to extend through the grounding conductor 2 and then through the thickness of the printed circuit board 1. Absent the slits 2b such as in the prior art device discussed with reference to FIG. 8, the voltage flowing in the high voltage circuit will be discharged to and, hence, leak into the low voltage circuit to such an extent as to eventually result in a shortcircuitting which is a hazardous condition.

The presence of the slits or any other openings such as, for example, holes, results in an increase of the edge-to-edge distance or leakage distance which in turn brings about an increase of the breakdown voltage, thereby ensuring an improved safety factor.

Referring now to FIGS. 4 to 6 showing a second preferred embodiment of the present invention, the grounding slits 2b employed in the foregoing preferred embodiment of the present invention are substituted by metal wiring pieces 2c. These metal wiring pieces 2c are disposed on the second surface of the printed circuit board so as to extend along the grounding conductor 2, each of said metal wiring pieces 2c having its opposite ends extending through the printed circuit board 1 and connected with the grounding conductor 2. With this arrangement, even though contaminants such as water droplets and/or dust deposit on the second surface of the printed circuit board 1 opposite to the first surface thereof where the grounding conductor 2 is formed, no leakage of electric power will occur. Also, even when the grounding conductor 2 breaks as a result of cracking occurring in the printed circuit board 1, the potential of the grounding conductor 2 can be kept at a ground potential since the metal wiring pieces 2c serve to connect separated areas of the grounding conductor 2, thereby eliminating the occurrence of any possible leakage of electric power.

FIG. 7 illustrates a high voltage power source device utilizable in the practice of any one of the foregoing preferred embodiments of the present invention. As shown therein, one of the paired commercial power lines leading from the commercial electric power source 14 is connected to the ground, and an electric power available from this power source 14 is rectified by a diode bridge network 13 and smoothed by the smoothing capacitor 9. An L-C resonant oscillation is achieved by a resonating capacitor 10 and an inductance of a primary winding 7 of the high voltage transformer, and an electric power resulting therefrom is controlled by the semiconductor switching element 8. Thus, a circuit from the power source 14 to the primary winding 7 of the high voltage transformer constitutes the low voltage circuit. The high voltage circuit is constituted by a circuit from the secondary winding 6 of the high voltage transformer to the magnetron 15, and one end of the high voltage circuit, that is, the low voltage terminal 6a of the secondary winding of the high voltage transformer is connected with the housing or any other framework of the electronic oven for grounding. This applies even where metal foils are employed in place of the metal wiring pieces 2c. while in general the housing or framework of the electronic oven has to be grounded to secure a safety factor, it is often observed that the housing or framework of the electronic oven is not connected to the ground. Should the housing or framework of the electronic oven be not connected to the ground, the occurrence of a leakage of electric power between the high and low voltage circuits as a result of deposition of contaminants such as, for example, water droplets and/or wetted dust on the printed circuit board 1 may result in that the housing or framework of the electronic oven is charged to a high voltage relative to the ground potential and may therefore pose a hazardous condition to the user of the electronic oven. For example, if the user of the electronic oven touches the housing or framework of the electronic oven, the user may get an electric shock. In this respect, any one of the first and second embodiment of the present invention which has been shown in and described with reference to FIGS. 1 to 3 and FIGS. 4 to 6 is effective to provide the high voltage power source device which is substantially free from any possible leakage of electric power which would occur not only on one surface of the printed circuit board, but also on the opposite surfaces thereof, thereby to avoid a charge build-up in the housing or framework of the electronic oven while safeguarding the user from any possible electric shock.

From the foregoing full description of the preferred embodiments of the present invention, the high voltage power source device according to the first preferred embodiment can bring about the following advantages.

(1) Since the grounding conductor and the grounding openings are formed on the opposite surfaces of the printed circuit board at the boundary between the high and low voltage circuits, the possibility of a leakage of electric power which would result from deposition of contaminants such as, for example, water droplets and/or wetted dust can be substantially eliminated.

(2) The provision of the openings such as, for example, slits or holes in the printed circuit board is effective to increase the edge-to-edge distance which represents the leakage distance and, therefore, the breakdown voltage of any one of the high and low voltage circuits can be increased with minimization of the occurrence of a leakage of electric power.

On the other hand, the high voltage power source device according to the second preferred embodiment of the present invention can bring about the following advantages.

(1) Since the grounding conductor and the generally elongated conductive pieces are formed on the opposite surfaces of the printed circuit board at the boundary between the high and low voltage circuits, the possibility of a leakage of electric power which would result from deposition of contaminants such as, for example, water droplets and/or wetted dust can be substantially eliminated.

(2) Even when the patterned grounding conductor breaks as a result of cracking in the printed circuit board, the conductive pieces can be connected at all times with the ground potential through the conductive pieces, thereby minimizing the possibility of leakage of electric power which would otherwise result in a short-circuitting.

Although the present invention has been described in connection with the preferred embodiments thereof with reference to the accompanying drawings, it is to be noted that various changes and modifications are apparent to those skilled in the art. Such changes and modifications are, unless departing from the scope of the present invention as defined by the appended claims, to be understood as included therein.

What is claimed is:

1. A high voltage power source device which comprises a printed circuit board having a low voltage circuit and a high voltage circuit formed respectively on separate areas of the printed circuit board; and a patterned grounding conductor formed in the printed circuit board at the boundary between the separate areas, said printed circuit board having a plurality of openings defined therein so as to extend completely through a thickness of the printed circuit in alignment with the patterned grounding conductor.

2. A high voltage power source device which comprises:

an electric power source;

an inverter circuit including a semiconductor switching element and a capacitor for converting an electric power from the electric power source into a high frequency electric power, said inverter circuit constituting a low voltage circuit;

a magnetron which requires a high voltage;

a high voltage transformer for converting the high frequency electric power into a high voltage and supplying the high voltage to the magnetron;

a printed circuit board having an electric wiring system formed thereon for connection with and support thereon of the inverter circuit and a high voltage circuit for the voltage boosted by the high voltage transformer, said printed circuit board having separate areas defined therein;

said low voltage circuit and said high voltage circuit being formed respectively on the separate areas of the printed circuit board;

a patterned grounding conductor formed on the printed circuit board at the boundary between the separate areas; and said printed circuit board also having a plurality of openings defined therein so as to extend completely through a thickness of the printed circuit in alignment with the patterned grounding conductor.

3. A high voltage power source device which comprises a printed circuit board having first and second surfaces opposite to each other and also having a low voltage circuit and a high voltage circuit formed respectively on separate areas of the first surface thereof; a patterned grounding conductor formed on the first surface of the printed circuit board at the boundary between the separate areas; and a plurality of generally elongated electroconductive pieces disposed on the second surface of the printed circuit board, each of said electroconductive piece having opposite ends connected to the patterned grounding conductor.

4. A high voltage power source device which comprises:
- an electric power source;
- an inverter circuit including a semiconductor switching element and a capacitor for converting an electric power from the electric power source into a high frequency electric power, said inverter circuit constituting a low voltage circuit;
- a magnetron which requires a high voltage;
- a high voltage transformer for converting the high frequency electric power into a high voltage and supplying the high voltage to the magnetron;
- a printed circuit board having an electric wiring system formed thereon for connection with and support thereon of the inverter circuit and a high voltage circuit for the voltage boosted by the high voltage transformer, said printed circuit board having separate areas defined therein;
- said low voltage circuit and said high voltage circuit being formed respectively on the separate areas of the printed circuit board;
- a patterned grounding conductor formed on the printed circuit board at the boundary between the separate areas; and
- a plurality of generally elongated electroconductive pieces disposed on one surface of the printed circuit board opposite to a surface thereof where the patterned grounding conductor is formed, each of said electroconductive piece having opposite ends connected to the patterned grounding conductor.

* * * * *